United States Patent
Yuan et al.

(10) Patent No.: US 11,424,294 B2
(45) Date of Patent: Aug. 23, 2022

(54) DISPLAY PANEL INCLUDING SUB-PIXELS ARRANGED IN AN ARRAY THAT COMPRISES N ROWS AND 4M COLUMNS AND DISPLAY DEVICE HAVING THE SAME

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 210 days.

(21) Appl. No.: 16/963,629

(22) PCT Filed: Sep. 10, 2019

(86) PCT No.: PCT/CN2019/105183
§ 371 (c)(1),
(2) Date: Jul. 21, 2020

(87) PCT Pub. No.: WO2021/046720
PCT Pub. Date: Mar. 18, 2021

(65) Prior Publication Data
US 2021/0202602 A1   Jul. 1, 2021

(51) Int. Cl.
*H01L 29/08* (2006.01)
*H01L 27/32* (2006.01)
*G09G 3/3258* (2016.01)

(52) U.S. Cl.
CPC ....... *H01L 27/3218* (2013.01); *G09G 3/3258* (2013.01); *H01L 27/3246* (2013.01); *H01L 27/3276* (2013.01)

(58) Field of Classification Search
CPC ............. H01L 27/3218; H01L 27/3246; H01L 27/3276; G09G 3/058
(Continued)

(56) References Cited

U.S. PATENT DOCUMENTS

2012/0268680 A1\* 10/2012 Sugiyama ......... G02F 1/133553
349/143
2014/0054624 A1\* 2/2014 Chen ........................ G09G 3/20
257/89
(Continued)

FOREIGN PATENT DOCUMENTS

CN      109166529 A    1/2019
CN      109308877 A    2/2019
(Continued)

*Primary Examiner* — Phuc T Dang
(74) *Attorney, Agent, or Firm* — Dilworth & Barrese, LLP.; Michael J. Musella, Esq.

(57) ABSTRACT

A display panel and a display device are disclosed. The display panel includes a plurality of sub-pixel units arranged in an array which includes N rows and 4M columns, sub-pixel units in each row is divided into a plurality of sub-pixel unit groups, and each sub-pixel unit group includes a first sub-pixel unit, a second sub-pixel unit, a third sub-pixel unit and a fourth sub-pixel unit which are sequentially in four adjacent columns along a first direction.

20 Claims, 9 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2017/0357345 A1* | 12/2017 | Ikeda | .................... H01L 27/323 |
| 2018/0047798 A1* | 2/2018 | Abe | .................... H01L 27/3272 |
| 2018/0210277 A1* | 7/2018 | Wang | .................. H01L 27/3218 |
| 2019/0035331 A1 | 1/2019 | Do et al. | |

FOREIGN PATENT DOCUMENTS

| | | |
|---|---|---|
| CN | 109523954 A | 3/2019 |
| CN | 109872697 A | 6/2019 |
| KR | 1020150027906 A | 3/2015 |
| KR | 102018130207 A | 12/2018 |

* cited by examiner

DISPLAY PANEL INCLUDING SUB-PIXELS ARRANGED IN AN ARRAY THAT COMPRISES N ROWS AND 4M COLUMNS AND DISPLAY DEVICE HAVING THE SAME

TECHNICAL FIELD

Embodiments of the present disclosure relate to a display panel and a display device.

BACKGROUND

In the field of organic light-emitting diode (OLED) displays, with the rapid development of high-resolution products, higher requirements are put forward for product yield, cost control and realization of narrow bezel.

SUMMARY

At least one embodiment of the present disclosure provides a display panel, comprising a plurality of sub-pixel units arranged in an array, and the array comprises N rows and 4M columns. Sub-pixel units in each row are divided into a plurality of sub-pixel unit groups, and each sub-pixel unit group comprises a first sub-pixel unit, a second sub-pixel unit, a third sub-pixel unit and a fourth sub-pixel unit which are sequentially in four adjacent columns along a first direction; each sub-pixel unit of the plurality of sub-pixel units comprises a light emitting circuit, a pixel driving circuit for driving the light emitting circuit to emit light, and a sensing circuit for sensing the pixel driving circuit to realize external compensation; the display panel further comprises (2N+2) gate lines which are arranged along the first direction and configured to provide a gate scanning signal to the plurality of sub-pixel units; the pixel driving circuit in each first sub-pixel unit in an (n)th row of sub-pixel unit groups and the pixel driving circuit in each third sub-pixel unit in the (n)th row of sub-pixel unit groups are both connected with a (2n−1)th gate line to receive the gate scanning signal and use the gate scanning signal as a scanning driving signal; the pixel driving circuit in each second sub-pixel unit in the (n)th row of sub-pixel unit groups and the pixel driving circuit in each fourth sub-pixel unit in the (n)th row of sub-pixel unit groups are both connected with a (2n)th gate line to receive the gate scanning signal and use the gate scanning signal as a scanning driving signal; the sensing circuit in each first sub-pixel unit in the (n)th row of sub-pixel unit groups and the sensing circuit in each third sub-pixel unit in the (n)th row of sub-pixel unit groups are both connected with a (2n+1)th gate line to receive the gate scanning signal and use the gate scanning signal as a sensing driving signal; the sensing circuit in each second sub-pixel unit in the (n)th row of sub-pixel unit groups and the sensing circuit in each fourth sub-pixel unit in the (n)th row of sub-pixel unit groups are both connected with a (2n+2)th gate line to receive the gate scanning signal and use the gate scanning signal as a sensing driving signal; the display panel further comprises a plurality of first data lines and a plurality of second data lines which are arranged along a second direction, in the second direction, both of the first sub-pixel unit and the second sub-pixel unit in the each sub-pixel unit group are connected with a same first data line to receive a data signal; in the second direction, both of the third sub-pixel unit and the fourth sub-pixel unit in the each sub-pixel unit group are connected with a same second data line to receive a data signal; and $1 \leq n \leq N$, M is an integer greater than or equal to 1, and N is an integer greater than or equal to 2.

For example, in the display panel provided by at least one embodiment of the present disclosure, two gate lines are between every two adjacent rows of sub-pixel units, and two gate lines are respectively arranged at two sides of the array along the second direction.

For example, in the display panel provided by at least one embodiment of the present disclosure, in the each sub-pixel unit group, the first data line is between the first sub-pixel unit and the second sub-pixel unit, and the second data line is between the third sub-pixel unit and the fourth sub-pixel unit.

For example, in the display panel provided by at least one embodiment of the present disclosure, the first direction is a row direction of the array, and the second direction is a column direction of the array.

For example, the display panel provided by at least one embodiment of the present disclosure further comprises a plurality of sensing lines extending along the second direction, in the second direction, the first sub-pixel unit, the second sub-pixel unit, the third sub-pixel unit and the fourth sub-pixel unit in the each sub-pixel unit group are all connected with a same sensing line to receive a reference voltage signal or output a sensing voltage signal.

For example, in the display panel provided by at least one embodiment of the present disclosure, in the each sub-pixel unit group, the same sensing line is between the second sub-pixel unit and the third sub-pixel unit.

For example, in the display panel provided by at least one embodiment of the present disclosure, in the each sub-pixel unit group, the first sub-pixel unit, the second sub-pixel unit, the third sub-pixel unit and the fourth sub-pixel unit are axially symmetrically distributed with respect to the same sensing line.

For example, the display panel provided by at least one embodiment of the present disclosure further comprises a plurality of power supply voltage lines extending along the second direction, in every two adjacent sub-pixel unit groups, the third sub-pixel unit and the fourth sub-pixel unit which are in a left sub-pixel unit group and the first sub-pixel unit and the second sub-pixel unit which are in a right sub-pixel unit group are all connected with a same power supply voltage line to receive a first power supply voltage.

For example, in the display panel provided by at least one embodiment of the present disclosure, in the second direction, the same power supply voltage line is between the two adjacent sub-pixel unit groups.

For example, the display panel provided by at least one embodiment of the present disclosure further comprises a power supply voltage bus, wherein the plurality of power supply voltage lines are respectively connected with the power supply voltage bus.

For example, in the display panel provided by at least one embodiment of the present disclosure, the plurality of power supply voltage lines are further configured to be detected in a detection stage to determine whether each of the plurality of power supply voltage lines is defective.

For example, in the display panel provided by at least one embodiment of the present disclosure, the sensing circuit is configured to sense the pixel driving circuit to obtain a threshold voltage or electron mobility of the pixel driving circuit.

For example, in the display panel provided by at least one embodiment of the present disclosure, the pixel driving circuit comprises a data writing circuit, a driving circuit and a charge storage circuit; the driving circuit is connected with the data writing circuit, the charge storage circuit, the light emitting circuit and the sensing circuit, and is configured to control a driving current for driving the light emitting circuit to emit light; the data writing circuit is further connected with the charge storage circuit, and is configured to receive the scanning driving signal and write the data signal into the driving circuit in response to the scanning driving signal; the sensing circuit is further connected with the charge storage circuit and the light emitting circuit, and is configured to receive the sensing driving signal, and write a reference voltage signal into the driving circuit or read out a sensing voltage signal from the driving circuit in response to the sensing driving signal; and the charge storage circuit is further connected with the light emitting circuit, and is configured to store the data signal and the reference voltage signal that are written into the charge storage circuit.

For example, in the display panel provided by at least one embodiment of the present disclosure, the data writing circuit comprises a first transistor, a gate electrode of the first transistor is configured to receive the gate scanning signal, a first electrode of the first transistor is configured to receive the data signal, and a second electrode of the first transistor is connected with a first node; the driving circuit comprises a second transistor, a gate electrode of the second transistor is connected with the first node, a first electrode of the second transistor is connected with a power supply voltage line to receive a first power supply voltage, and a second electrode of the second transistor is connected with a second node; the charge storage circuit comprises a storage capacitor, a first electrode of the storage capacitor is connected with the first node, and a second electrode of the storage capacitor is connected with the second node; the sensing circuit comprises a third transistor, a gate electrode of the third transistor is configured to receive the gate scanning signal and use the gate scanning signal as a sensing driving signal, a first electrode of the third transistor is connected with a sensing line, and a second electrode of the third transistor is connected with the second node; and the light emitting circuit comprises an organic light-emitting diode, a first electrode of the organic light-emitting diode is connected with the second node, and a second electrode of the organic light-emitting diode is configured to receive a second power supply voltage.

For example, in the display panel provided by at least one embodiment of the present disclosure, in the each sub-pixel unit group, light emitted by the first sub-pixel unit, the second sub-pixel unit, the third sub-pixel unit and the fourth sub-pixel unit comprises red light, green light and blue light.

For example, in the display panel provided by at least one embodiment of the present disclosure, in the sub-pixel units in each row, light emitted by the sub-pixel units are circulated according to an order of red light, green light, and blue light along the first direction.

For example, in the display panel provided by at least one embodiment of the present disclosure, in the each sub-pixel unit group, the light emitted by the first sub-pixel unit, the second sub-pixel unit, the third sub-pixel unit and the fourth sub-pixel unit further comprises white light.

For example, in the display panel provided by at least one embodiment of the present disclosure, in the each sub-pixel unit group, an order of the light emitted by the first sub-pixel unit, the second sub-pixel unit, the third sub-pixel unit and the fourth sub-pixel unit is red light, green light, blue light and white light.

For example, in the display panel provided by at least one embodiment of the present disclosure, the sub-pixel units adopt top emission structures.

For example, the display panel provided by at least one embodiment of the present disclosure further comprises a pixel definition layer on an array substrate, the pixel definition layer has an opening in each sub-pixel unit, shapes of openings of the plurality of sub-pixel units are the same, and sizes of the openings of the plurality of sub-pixel units are the same.

At least one embodiment of the present disclosure further provides a display device comprising the display panel according to any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
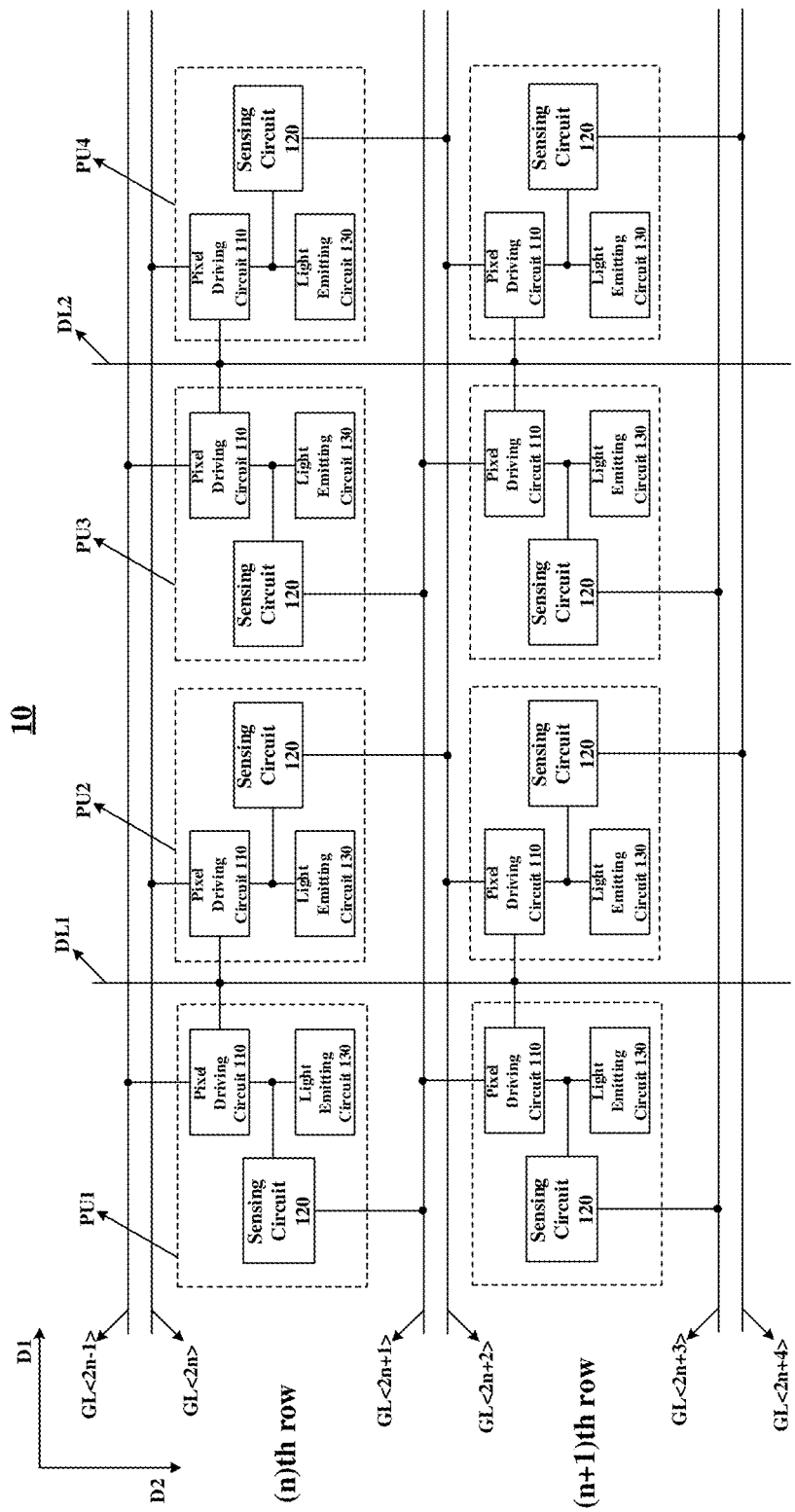
FIG. 1 is a schematic diagram of a display panel provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the OLED (Organic Light-Emitting Diode) display field, with the rapid development of high-resolution products, higher requirements are put forward for product yield, cost control and realization of narrow bezel. For example, compared with an OLED display device with a resolution of 4K, for an OLED display device with a resolution of 8K and a medium or small size, because the number of sub-pixel units required to be provided is multiplied, both of the number of pins, for a gate driving circuit, of a circuit board and the number of pins, for a source driving circuit (a data driving circuit), of a circuit board are multiplied, which may bring the following problems.

1) Because the number of pins of the circuit board is increased, the region used for bonding in a layout design becomes smaller, which may cause the yield of the final product to be decreased.

2) Because the number of pins of the circuit board is increased, the cost is significantly increased.

3) Because the numbers of gate lines and data lines that are required to be provided are increased, the region for disposing sub-pixel units becomes smaller, which is not beneficial to realize high resolution and narrow bezel.

The display panel and the display device provided by at least one embodiment of the present disclosure can reduce the number of the data lines without increasing the number of the gate lines by adopting a design for arranging sub-pixel units cooperating with a design for signal lines (for example, gate lines, data lines, sensing lines and the like), thereby improving the product yield, reducing the cost, and facilitating the realization of a narrow bezel.

At least one embodiment of the present disclosure provides a display panel 10. as illustrated in FIG. 1, the display panel 10 includes a plurality of sub-pixel units arranged in an array (as illustrated in the dashed boxes in FIG. 1), the array includes N rows and 4M columns, M is an integer greater than or equal to 1, and N is an integer greater than or equal to 2. It should be noted that the display panel 10 illustrated in FIG. 1 only schematically illustrates two rows (an (n)th row and an (n+1)th row) and four columns of sub-pixel units; the embodiments of the present disclosure include but are not limited to this, and the display panel 10 may further include more sub-pixel units as required.

For example, the sub-pixel units in each row is divided into a plurality of sub-pixel unit groups, and each sub-pixel unit group includes a first sub-pixel unit PU1, a second sub-pixel unit PU2, a third sub-pixel unit PU3 and a fourth sub-pixel unit PU4 which are sequentially located in four adjacent columns along a first direction D1. It should be noted that only one sub-pixel unit group is schematically illustrated in each row of sub-pixel units of the display panel 10 illustrated in FIG. 1, and the embodiments of the present disclosure include but are not limited to this.

For example, each sub-pixel unit of the plurality of sub-pixel units includes a light emitting circuit 130, a pixel driving circuit 110 for driving the light emitting circuit 130 to emit light, and a sensing circuit 120 for sensing the pixel driving circuit 110 to realize external compensation. For example, the sensing circuit 120 can be used to preform sensing on the pixel driving circuit 110 during a blanking period between two adjacent display frames, for example, to obtain parameters such as threshold voltage or electron mobility in the pixel driving circuit 110, such that the external compensation can be realized and the brightness uniformity of the display panel 10 can be improved.

The display panel 10 further includes (2N+2) gate lines arranged along the first direction D1, and the (2N+2) gate lines are configured to provide gate scanning signals to the plurality of sub-pixel units. For example, the first direction D1 is the row direction of the array of the display panel 10. For example, the display panel provided by the embodiments of the present disclosure adopts a dual-gate structure. For example, two gate lines are arranged between two adjacent rows of sub-pixel units, and two gate lines are respectively arranged at both sides of the array along a second direction D2. The following describes the connection relationship between the plurality of gate lines and each row of sub-pixel units.

The pixel driving circuit 110 in each first sub-pixel unit PU1 in the (n)th row ($1 \leq n \leq N$) of sub-pixel unit groups and the pixel driving circuit 110 in each third sub-pixel unit PU3 in the (n)th row of sub-pixel unit groups are both connected with the (2n−1)th gate line GL<2n−1> to receive the gate scanning signal and use the gate scanning signal as a scanning driving signal. For example, the scanning driving signal can control the pixel driving circuit 110 to be turned on or turned off.

The pixel driving circuit 110 in each second sub-pixel unit PU2 in the (n)th row of sub-pixel unit groups and the pixel driving circuit 110 in each fourth sub-pixel unit PU4 in the (n)th row of sub-pixel unit groups are both connected with the (2n)th gate line GL<2n> to receive the gate scanning signal and use the gate scanning signal as a scanning driving signal.

The sensing circuit 120 in each first sub-pixel unit PU1 in the (n)th row of sub-pixel unit groups and the sensing circuit 120 in each third sub-pixel unit PU3 in the (n)th row of sub-pixel unit groups are both connected with a (2n+1)th gate line GL<2n+1> to receive the gate scanning signal and use the gate scanning signal as a sensing driving signal. For example, the sensing driving signal can control the sensing circuit 120 to be turned on or turned off.

The sensing circuit 120 in each second sub-pixel unit PU2 in the (n)th row of sub-pixel unit groups and the sensing circuit 120 in each fourth sub-pixel unit PU4 in the (n)th row of sub-pixel unit groups are both connected with a (2n+2)th gate line GL<2n+2> to receive the gate scanning signal and use the gate scanning signal as a sensing driving signal.

The pixel driving circuit 110 in each first sub-pixel unit PU1 in the (n+1)th row of sub-pixel unit groups and the pixel driving circuit 110 in each third sub-pixel unit PU3 in the (n+1)th row of sub-pixel unit groups are both connected with the (2n+1)th gate line GL<2n+1> to receive the gate scanning signal and use the gate scanning signal as a scanning driving signal.

The pixel driving circuit 110 in each second sub-pixel unit PU2 in the (n+1)th row of sub-pixel unit groups and the pixel driving circuit 110 in each fourth sub-pixel unit PU4 in the (n+1)th row of sub-pixel unit groups are connected with the (2n+2)th gate line GL<2n+2> to receive the gate scanning signal and use the gate scanning signal as a scanning driving signal.

The sensing circuit 120 in each first sub-pixel unit PU1 in the (n+1)th row of sub-pixel unit groups and the sensing circuit 120 in each third sub-pixel unit PU3 in the (n+1)th row of sub-pixel unit groups are both connected with a (2n+3)th gate line GL<2n+3> to receive the gate scanning signal and use the gate scanning signal as a sensing driving signal.

The sensing circuit 120 in each second sub-pixel unit PU2 in the (n+1)th row of sub-pixel unit groups and the sensing circuit 120 in each fourth sub-pixel unit PU4 in the (n+1)th row of sub-pixel unit groups are both connected with a (2n+4)th gate line GL<2n+4> to receive the gate scanning signal and use the gate scanning signal as the sensing driving signal.

It should be noted that, in the above embodiments, for each sub-pixel unit group, the first sub-pixel unit PU1 and the third sub-pixel unit PU3 are connected with a same gate line, and the second sub-pixel unit PU2 and the fourth sub-pixel unit PU4 are connected with another same gate line. The embodiments of the present disclosure include but are not limited to this case. For example, the first sub-pixel unit PU1 and the fourth sub-pixel unit PU4 may be connected with a same gate line, and the second sub-pixel unit PU2 and the third sub-pixel unit PU3 may be connected with another same gate line.

As illustrated in FIG. 1, in the display panel 10 provided by the embodiments of the present disclosure, for the sub-pixel units located in the same column, the sensing circuit 120 in the (n)th row of sub-pixel unit and the pixel driving circuit 110 in the (n+1)th row of sub-pixel unit share the same gate line, so that the number of the gate lines that need to be set can be reduced.

For example, the display panel 10 further includes a plurality of first data lines DL1 and a plurality of second data lines DL2 arranged along the second direction D2; in the second direction D2, the first sub-pixel unit PU1 and the second sub-pixel unit PU2 which are in each sub-pixel unit group are both connected with the same first data line DL1 to receive a data signal; in the second direction D2, the third sub-pixel unit PU3 and the fourth sub-pixel unit PU4 which are in each sub-pixel unit group are both connected with the same second data line DL2 to receive another data signal.

For example, the second direction D2 is the column direction of the array of the display panel 10. For example, the first direction D1 and the second direction D2 intersect with each other. For example, the first direction D1 is perpendicular to the second direction D2.

In the display panel 10 provided by the embodiments of the present disclosure, in each sub-pixel unit group, the first sub-pixel unit PU1 and the second sub-pixel unit PU2 share the same first data line DL1, and the third sub-pixel unit PU3 and the fourth sub-pixel unit PU4 share the same second data line DL2. Therefore, for the display panel including 4M columns of sub-pixel units, only M first data lines DL1 and M second data lines DL2 need to be provided, so that the number of the data lines that need to be provided can be reduced.

The display panel 10 provided by at least one embodiment of the present disclosure can reduce the number of data lines required to be provided without increasing the number of gate lines by sharing the data lines, so as to reduce the area of the region occupied by the data lines, such that the display panel 10 enables the sub-pixel units to be arranged in a region with a larger size, and the resolution of the display panel 10 can be improved, which is beneficial to realize a display panel with high PPI (Pixels Per Inch) and a narrow bezel. On the other hand, because the number of data lines required to be arranged are decreased, the number of pins, for the source driving circuit, of a circuit board is decreased, such that the processing yield of the display panel 10 can be improved and the production cost of the display panel 10 can be reduced.

For example, in the display panel 10 provided by some embodiments of the present disclosure, as illustrated in FIG. 1, in each sub-pixel unit group, the first data line DL1 is located between the first sub-pixel unit PU1 and the second sub-pixel unit PU2, and the second data line DL2 is located between the third sub-pixel unit PU3 and the fourth sub-pixel unit PU4.

In addition, it should be noted that in the display panel 10 provided by the embodiments of the present disclosure, descriptions are given by taking the case that the display panel 10 includes 4M columns of sub-pixel units as an example, but the embodiments of the present disclosure do not limit the number of columns of sub-pixel units included in the display panel 10. For example, the number of columns of sub-pixel units included in the display panel 10 can also be not an integer multiple of 4, and in this case, for the sub-pixel units in each row, there may be one, two or three sub-pixel unit(s) that cannot form a sub-pixel unit group.

Figure 2:
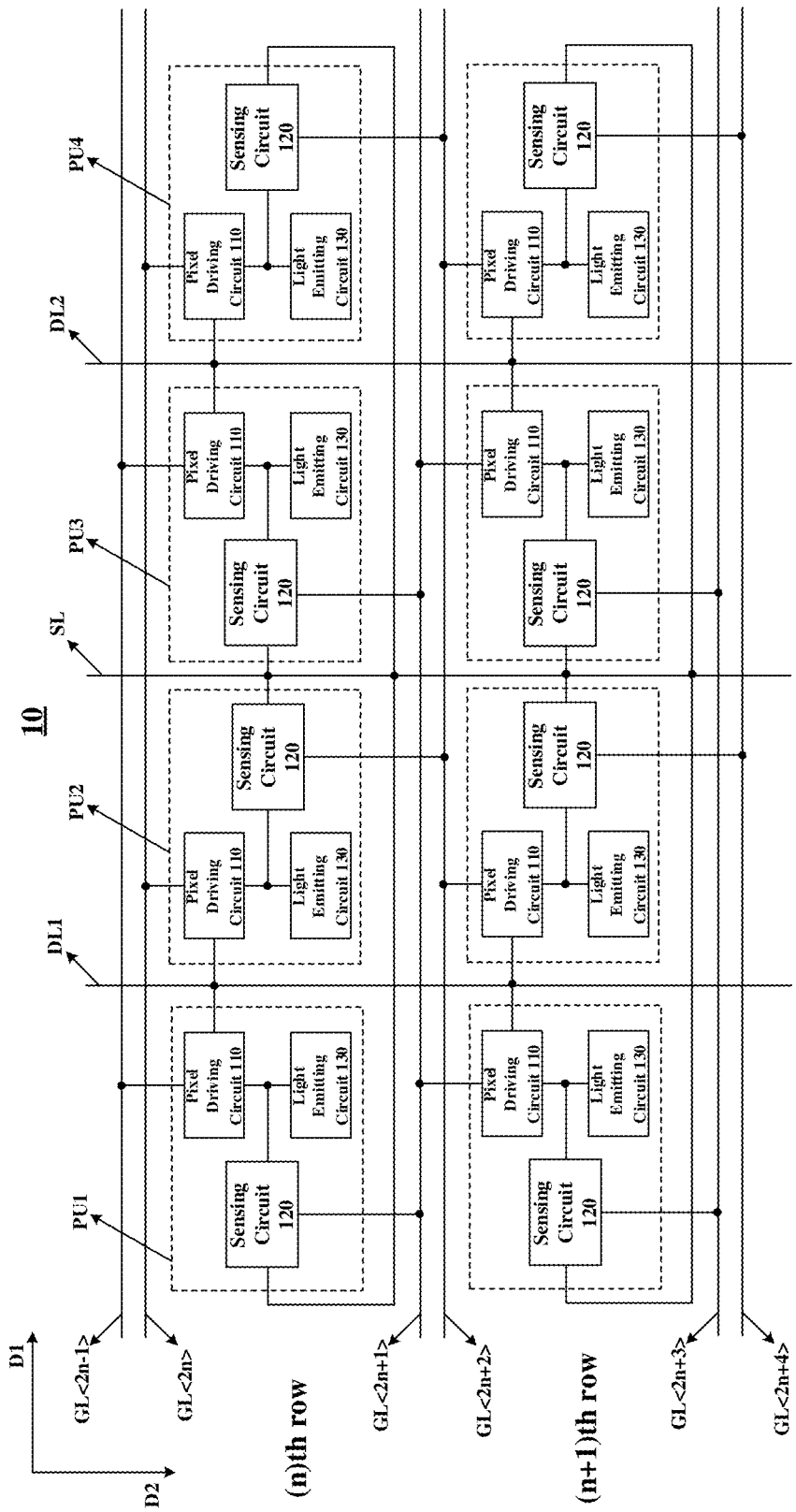
FIG. 2 is a schematic diagram of another display panel provided by at least one embodiment of the present disclosure.

As illustrated in FIG. 2, the display panel 10 provided by some embodiments of the present disclosure may further include a plurality of sensing lines SL arranged extending along the second direction D2.

In the second direction D2, the first sub-pixel unit PU1, the second sub-pixel unit PU2, the third sub-pixel unit PU3 and the fourth sub-pixel unit PU4 in each sub-pixel unit group are all connected with the same sensing line SL to receive a reference voltage signal or output a sensing voltage signal. For example, the reference voltage signal is a low-level voltage signal, for example, the level of the low-level voltage signal is 0V.

For example, the reference voltage signal can be provided to the sensing circuit 120 through the sensing line SL, and in the case that the sensing circuit 120 is turned on, the reference voltage signal can be provided to the light emitting circuit 130 and the pixel driving circuit 110 to perform, for example, a reset operation on the light emitting circuit 130 and the pixel driving circuit 110.

For example, during the blanking period between two adjacent display frames, the sensing circuit 120 can be turned on, so that the sensing voltage signal obtained by sensing the pixel driving circuit 110 is output through the sensing line SL, thereby realizing the external compensation, and thus the brightness uniformity of the display panel 10 can be improved. For example, the sensing circuit 120 can realize compensation for threshold voltage, electron mobility and the light emitting circuit 130 in the pixel driving circuit 110.

For example, in the display panel 10 provided by some embodiments of the present disclosure, as illustrated in FIG. 2, in each sub-pixel unit group, the sensing line SL is located between the second sub-pixel unit PU2 and the third sub-pixel unit PU3.

For example, in each sub-pixel unit group, the first sub-pixel unit PU1, the second sub-pixel unit PU2, the third sub-pixel unit PU3 and the fourth sub-pixel unit PU4 are axially symmetrically distributed with respect to the sensing line SL.

In the display panel 10 provided by the embodiments of the present disclosure, for each sub-pixel unit group, the layout structure can be optimized in layout design by adopting this axisymmetric distribution design with respect to the sensing line SL, thereby reducing the risk of short circuit and further improving the yield.

Figure 3:
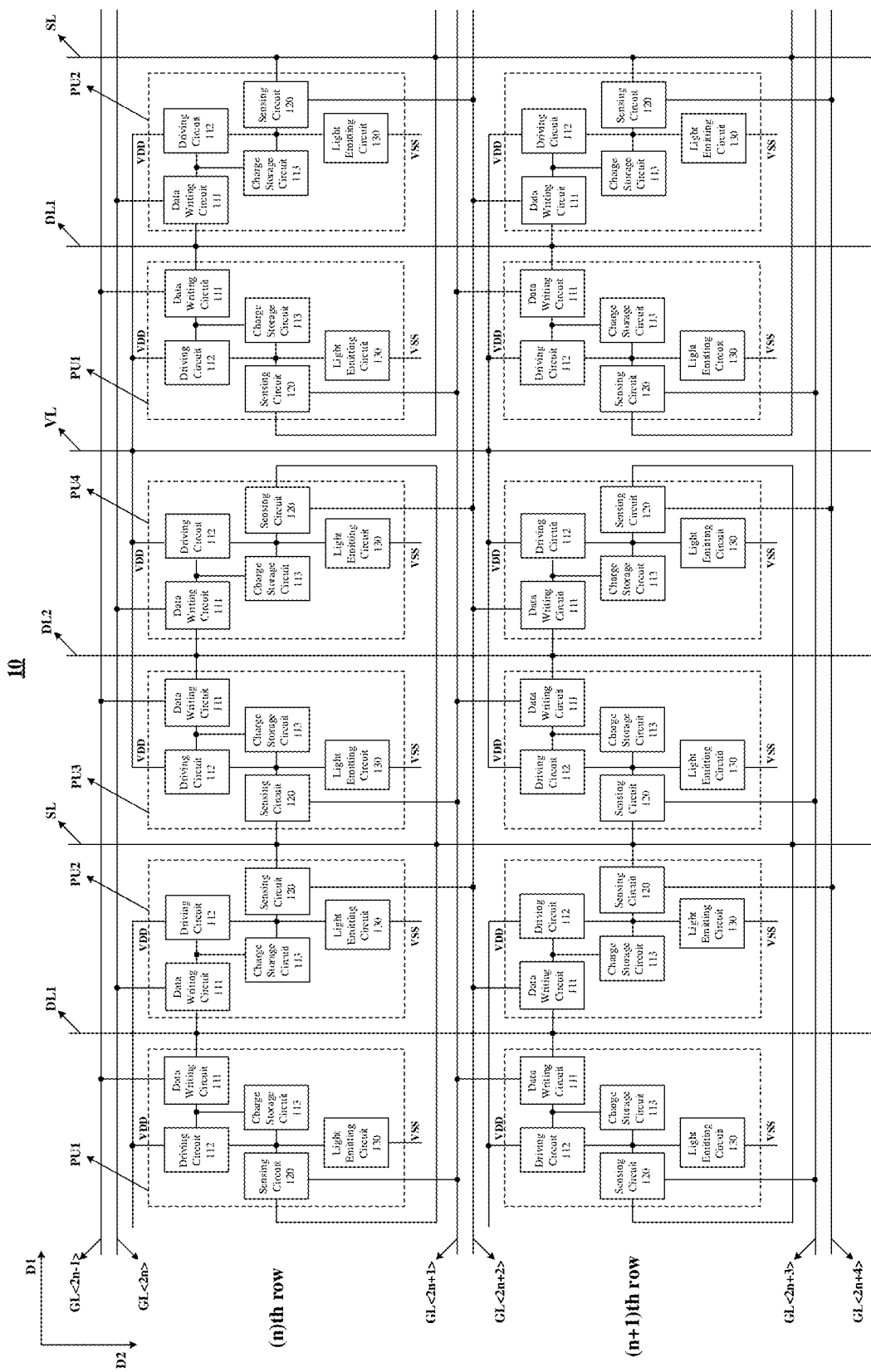
FIG. 3 is a schematic diagram of still another display panel provided by at least one embodiment of the present disclosure.

As illustrated in FIG. 3, the display panel 10 provided by some embodiments of the present disclosure may further include a plurality of power supply voltage lines VL arranged extending along the second direction D2. It should be noted that FIG. 3 schematically illustrates only two rows and six columns of sub-pixel units in the display panel 10 and only one power supply voltage line VL, and the embodiments of the present disclosure do not limit the number of power supply voltage lines VL included in the display panel 10.

For example, in every two adjacent sub-pixel unit groups, the third sub-pixel unit PU3 and the fourth sub-pixel unit PU4 which are in the left sub-pixel unit group and the first sub-pixel unit PU1 and the second sub-pixel unit PU2 which are in the right sub-pixel unit group are all connected with the same power supply voltage line VL to receive a first power supply voltage (e.g., power supply voltage VDD). For example, the first power supply voltage is a high-level voltage. For example, the first power supply voltage is applied to the pixel driving circuit 110 to generate the driving current for driving the light emitting circuit 130 to emit light.

For example, as illustrated in FIG. 3, in the second direction D2, the power supply voltage line VL is located between two adjacent sub-pixel unit groups. As illustrated in FIG. 3, in the same row of sub-pixel unit groups, because there is no need to set the data line or the sensing line between two adjacent sub-pixel unit groups, this partial region can be used to set the power supply voltage line VL.

Figure 9:
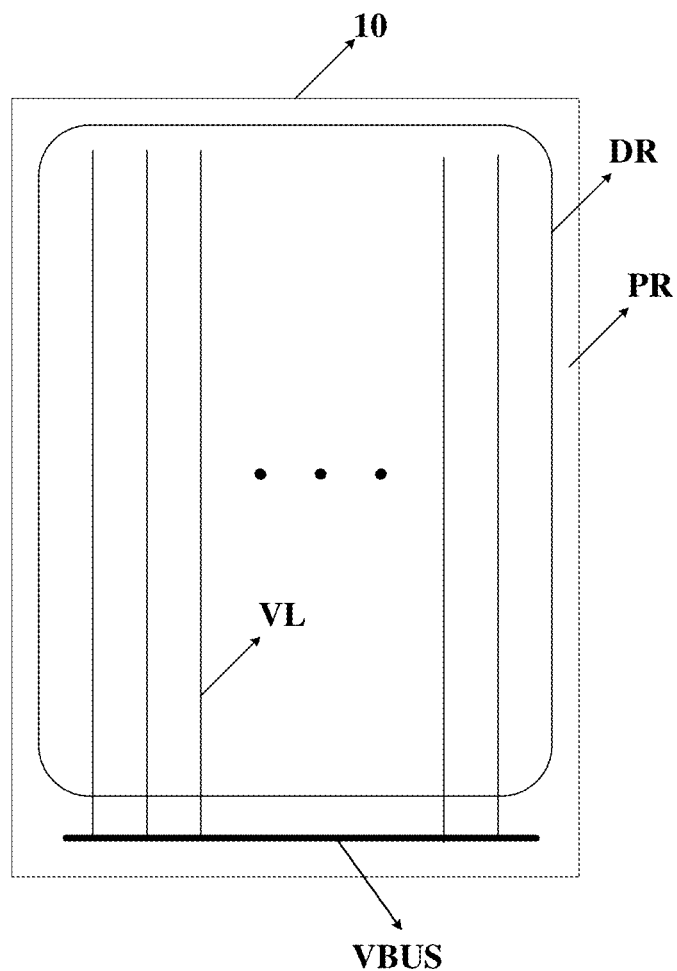
FIG. 9 is a schematic diagram of yet still another display panel provided by at least one embodiment of the present disclosure.

For example, as illustrated in FIG. 9, the display panel 10 provided by the embodiments of the present disclosure includes a display region DR and a peripheral region PR disposed around the display region DR. For example, a plurality of sub-pixel units arranged in an array as arranged in the display region DR, for example, the plurality of sub-pixel units arranged in the array as illustrated in the embodiments illustrated in FIG. 1-FIG. 3 above. For example, driving circuits (e.g., a gate driving circuit and a source driving circuit) for the plurality of sub-pixel units in the display region DR can be provided in the peripheral region PR. For example, the plurality of power supply voltage lines VL extend from the display region DR to a side of the peripheral region PR.

As illustrated in FIG. 9, the display panel 10 provided by some embodiments of the present disclosure further includes a power supply voltage bus VBUS, and the power supply voltage bus VBUS is connected with a power supply management circuit to receive the first power supply voltage (e.g., the power supply voltage VDD). The plurality of power supply voltage lines VL are connected with the power supply voltage bus VBUS respectively. For example, the power supply voltage bus VBUS can be disposed in the peripheral region PR. For example, the power supply voltage bus VBUS can be connected with the source driving circuit, so that the source driving circuit respectively provides first power supply voltages, which are equal to each other, to the plurality of power supply voltage lines VL through the power supply voltage bus VBUS.

For example, in a display panel, a mesh electrode can be used to provide the first power supply voltage, and all of the plurality of sub-pixel units in the display panel are connected with the mesh electrode to receive the first power supply voltage. The structure using this mesh electrode is referred to as a mesh structure. In the case that a defect (such as short circuit defect or broken defect) occurs at any position of the mesh electrode in the display panel using the mesh structure, all of the sub-pixel units of the display panel are affected.

As described above, with respect to the mesh structure, the power supply voltage lines VL in the display panel 10 provided by the embodiments of the present disclosure adopt a non-mesh structure. Even in the case that a certain one of the plurality of power supply voltage lines VL is defective, only the sub-pixel units connected with this power supply voltage line VL are affected, without affecting the sub-pixel units connected with other power supply voltage lines VL, thus improving the redundancy and stability of the display panel 10.

For example, in the display panel 10 provided by some embodiments of the present disclosure, the plurality of power supply voltage lines VL are further configured to be detected in a detection stage to determine whether each of the plurality of power supply voltage lines VL is defective.

For example, before the display panel 10 leaves the factory, the display panel 10 may be detected to determine whether the display panel 10 meets product requirements. For example, in the detection stage, whether a defect occurs can be determined by detecting parameters such as voltages and currents of the plurality of power supply voltage lines VL respectively. Compared with the display panel adopting the mesh structure, the display panel 10 adopting the non-mesh structure provided by the embodiments of the present disclosure can locate the position, at which a defect is present, of the power supply voltage line VL, such that the above defect can be eliminated.

As illustrated in FIG. 3, in the display panel 10 provided by some embodiments of the present disclosure, the pixel driving circuit 110 includes a data writing circuit 111, a driving circuit 112 and a charge storage circuit 113.

The driving circuit 112 is connected with the data writing circuit 111, the charge storage circuit 113, the light emitting circuit 130 and the sensing circuit 120, and the driving circuit 112 is configured to control the driving current for driving the light emitting circuit 130 to emit light. For example, the driving circuit 112 is connected with the power supply voltage line VL to receive the first power supply voltage.

The data writing circuit 111 is further connected with the charge storage circuit 113, and is configured to receive the scanning driving signal and write the data signal into the driving circuit 112 in response to the scanning driving signal. For example, the data writing circuit 111 is connected with a gate line GL to receive the scanning driving signal and connected with a data line (the first data line DL1 or the second data line DL2) to receive the data signal.

The sensing circuit 120 is further connected with the charge storage circuit 113 and the light emitting circuit 130, and the sensing circuit 120 is configured to receive the sensing driving signal and write the reference voltage signal into the driving circuit 112 or read out the sensing voltage signal from the driving circuit 112 in response to the sensing driving signal. For example, the sensing circuit 120 is connected with a gate line GL to receive the sensing driving signal, and the sensing circuit 120 is further connected with a sensing line SL to receive the reference voltage signal or output the sensing voltage signal.

The charge storage circuit 113 is further connected with the light emitting circuit 130 and configured to store the data signal and the reference voltage signal that are written into the charge storage circuit. For example, the light emitting circuit 130 is configured to receive a second power supply voltage VSS.

The implementation example of each circuit in the sub-pixel unit in FIG. 3 will be described with reference to FIG. 4A. The following description will take the sub-pixel unit (first sub-pixel unit PU1) in the first column and in the (n)th row as an example.

Figure 4A:
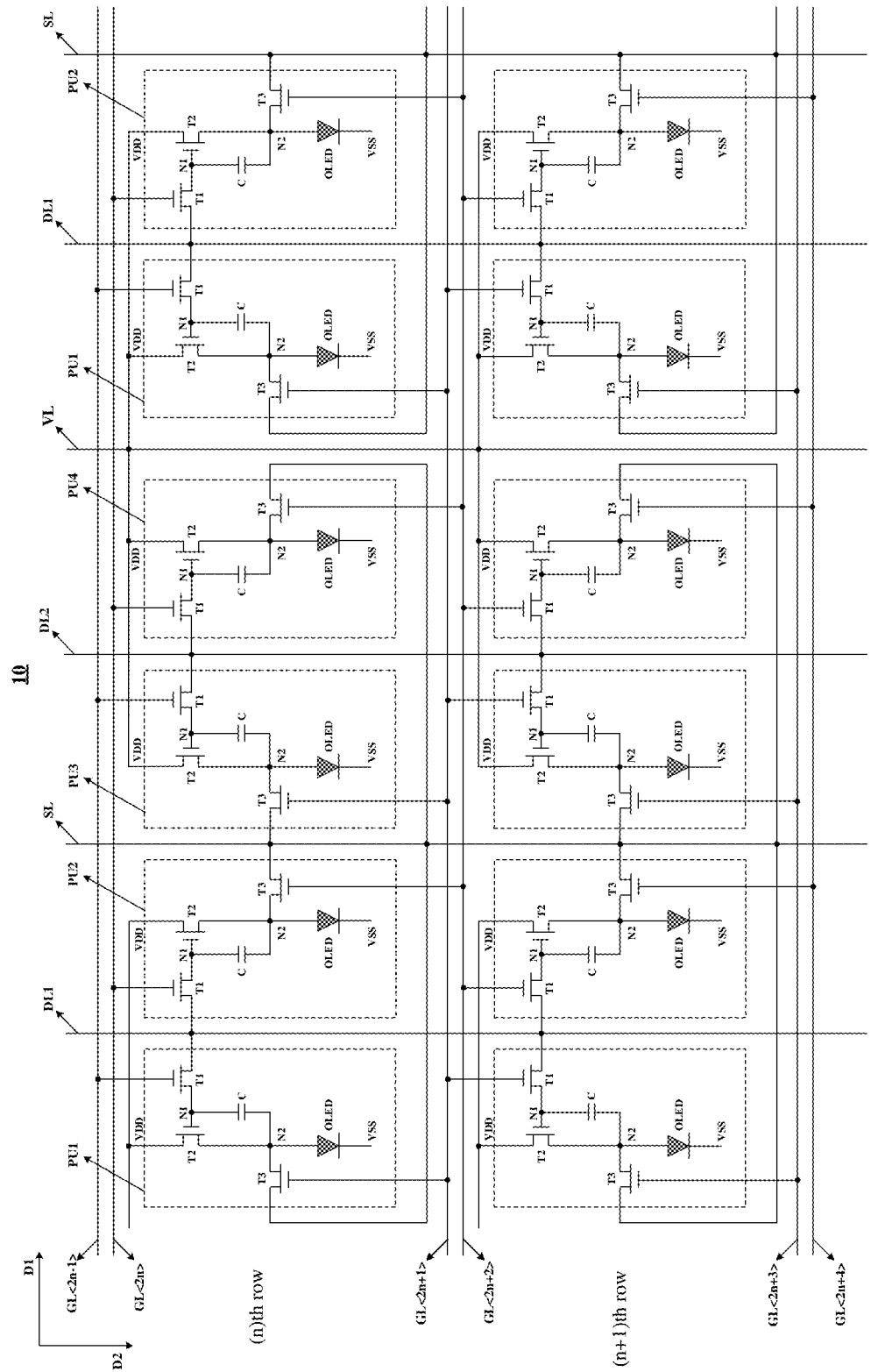
FIG. 4A is a circuit diagram corresponding to an implementation example of FIG. 3 provided by at least one embodiment of the present disclosure.

For example, as illustrated in FIG. 4A, the data writing circuit 111 can be implemented as a first transistor T1. A gate electrode of the first transistor T1 is connected with the gate line GL<2n−1>, a first electrode of the first transistor T1 is connected with the first data line DL1, and a second electrode of the first transistor T1 is connected with a first node N1.

The driving circuit 112 can be implemented as a second transistor T2. A gate electrode of the second transistor T2 is connected with the first node N1, a first electrode of the second transistor T2 is connected with the power supply voltage line VL to receive the first power supply voltage, and a second electrode of the second transistor T2 is connected with a second node N2.

The charge storage circuit 113 can be implemented as a storage capacitor C, a first electrode of the storage capacitor C is connected with the first node N1, and a second electrode of the storage capacitor C is connected with the second node N2.

The sensing circuit 120 can be implemented as a third transistor T3. A gate electrode of the third transistor T3 is connected with the gate line GL<2n+1>, a first electrode of the third transistor T3 is connected with the sensing line SL, and a second electrode of the third transistor T3 is connected with the second node N2.

The light emitting circuit 130 can be implemented as an OLED. The OLED can be of various types, such as top emission type, bottom emission type or the like, and can emit red light, green light, blue light or white light, etc., which are not limited by the embodiments of the present disclosure. A first electrode (e.g., anode) of the OLED is connected with the second node N2, and a second electrode (e.g., cathode) of the OLED is configured to receive the second power supply voltage VSS.

For example, in some embodiments, the second electrode of the OLED is configured to be grounded, and in this case, the second power supply voltage VSS is 0V. For example, the first power supply voltage provided by the power supply voltage line VL is a high-level voltage (e.g., 5V, 10V or other suitable voltage), and the second power supply voltage VSS is a low-level voltage (e.g., 0V, −5V, −10V or other suitable voltage). In the case that the second transistor T2 is turned on (or partially turned on), the first power supply voltage and the second power supply voltage VSS can be regarded as one power supply, and this power supply is used to generate the driving current for driving the OLED.

It should be noted that the example implementation of each circuit in other sub-pixel units in FIG. 4A can be referred to FIG. 4A, and will not be repeated here.

Each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, the transistors can be divided into N-type and P-type transistors according to the characteristics of the transistors. In a case where the transistor is the P-type transistor, the turn-on voltage is a low level voltage (e.g., 0V, −5V, −10V, or other suitable voltage), and the turn-off voltage is a high level voltage (e.g., 5V, 10V, or other suitable voltage). In a case where the transistor is the N-type transistor, the turn-on voltage is a high level voltage (for example, 5V, 10V or other suitable voltage), and the turn-off voltage is a low level voltage (for example, 0V, −5V, −10V or other suitable voltage).

Figure 4B:
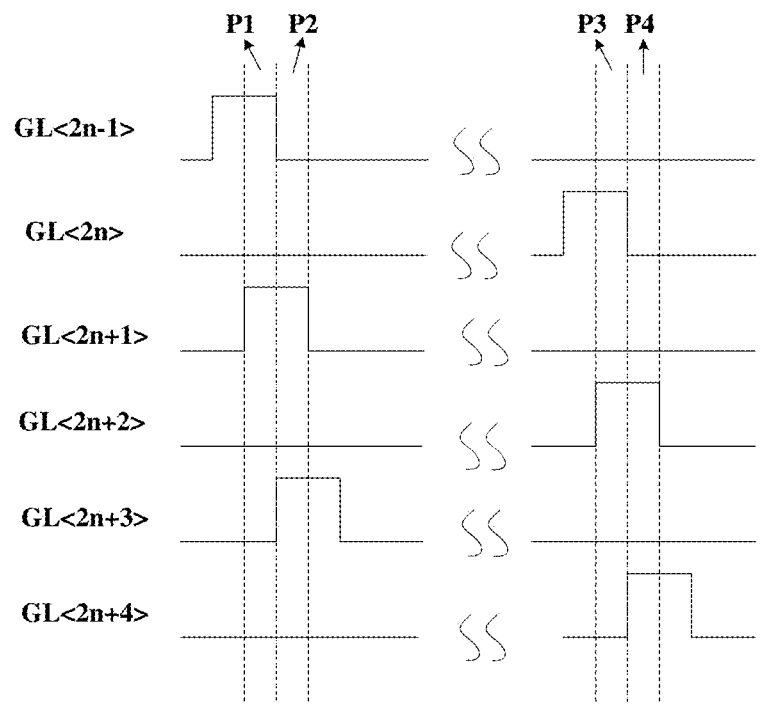
FIG. 4B is a signal timing diagram corresponding to the working principle of the display panel illustrated in FIG. 4A.

The working principle of the display panel 10 illustrated in FIG. 4A will be described with reference to the signal timing diagram illustrated in FIG. 4B. It should be noted that following description is given by taking the case that the transistors in FIG. 4A are N-type transistors as an example.

In a first period P1, the gate scanning signal provided by the gate line GL<2n+1> is at a high level, and the first sub-pixel unit PU1 and the third sub-pixel unit PU3 which are in the (n)th row are respectively written with corresponding data signals.

Meanwhile, in the first period P1, because the gate scanning signal provided by the gate line GL<2n+1> is also at a high level, the first transistors T1 in the first sub-pixel unit PU1 and the third sub-pixel unit PU3 which are in the (n+1)th row are also turned on, and this period is equivalent to pre-charging the first sub-pixel unit PU1 and the third sub-pixel unit PU3 which are in the (n+1)th row, which does not affect the display effect.

Meanwhile, in the first period P1, because the gate scanning signal provided by the gate line GL<2n+1> is also at a high level, the third transistors T3 in the first sub-pixel unit PU1 and the third sub-pixel unit PU3 which are in the (n)th row are also turned on, so that the reference voltage signal provided by the sensing line SL can be provided to the second node N2, that is, the second electrode of the storage capacitor C, through the third transistors T3 that are turned on, so that one electrode of the storage capacitor C is kept at a fixed level that is not changed, which is more conductive to the writing of the data signal.

In a second period P2, the gate scanning signal provided by the gate line GL<2n+1> is at a high level, and the first sub-pixel unit PU1 and the third sub-pixel unit PU3 which are in the (n+1)th row are respectively written with corresponding data signals.

Meanwhile, in the second period P2, because the gate scanning signal provided by the gate line GL<2n+3> is also at a high level, the third transistors T3 in the first sub-pixel unit PU1 and the third sub-pixel unit PU3 which are in the (n+1)th row are also turned on, so that the reference voltage signal provided by the sensing line SL can be provided to the second node N2, that is, the second electrode of the storage capacitor C, through the third transistors T3 that are turned on, so that one electrode of the storage capacitor C is kept at a fixed level that is not changed, which is more conductive to the writing of the data signal.

Then, progressive scanning is performed until that writing of the data signal are accomplished for the last row (that is, the (N)th row) of the display panel 10, and then a third period P3 is entered.

In the third period P3, the gate scanning signal provided by the gate line GL<2n> is at a high level, and the second sub-pixel unit PU2 and the fourth sub-pixel unit PU4 which are in the (n)th row are respectively written with corresponding data signals.

Meanwhile, in the third period P3, because the gate scanning signal provided by the gate line GL<2n+2> is also at a high level, the first transistors T1 in the second sub-pixel unit PU2 and the fourth sub-pixel unit PU4 which are in the (n+1)th row are also turned on, and this period is equivalent to pre-charging the second sub-pixel unit PU2 and the fourth sub-pixel unit PU4 which are in the (n+1)th row, which does not affect the display effect.

Meanwhile, in the third period P3, because the gate scanning signal provided by the gate line GL<2n+2> is also at a high level, the third transistors T3 in the second sub-pixel unit PU2 and the fourth sub-pixel unit PU4 which are in the (n)th row are also turned on, so that the reference voltage signal provided by the sensing line SL can be provided to the second node N2, that is, the second electrode of the storage capacitor C, through the third transistors T3 that are turned on, so that one electrode of the storage capacitor C is kept at a fixed level that is not changed, which is more conductive to the writing of the data signal.

In a fourth period P4, the gate scanning signal provided by the gate line GL<2n+2> is at a high level, and the second sub-pixel unit PU2 and the fourth sub-pixel unit PU4 which are in the (n+1)th row are respectively written with corresponding data signals.

Meanwhile, in the fourth period P4, because the gate scanning signal provided by the gate line GL<2n+4> is also at a high level, the third transistors T3 in the second sub-pixel unit PU2 and the fourth sub-pixel unit PU4 which are in the (n+1)th row are also turned on, so that the reference voltage signal provided by the sensing line SL can be provided to the second node N2, that is, the second electrode of the storage capacitor C, through the third transistors T3 that are turned on, so that one electrode of the storage capacitor C is kept at a fixed level that is not changed, which is more conductive to the writing of the data signal.

Then, progressive scanning is performed until that writing of the data signal are accomplished for the last row (that is, the (N)th row) of the display panel 10, thereby completing scanning and driving of the entire display panel 10.

The first sub-pixel unit PU1 and the second sub-pixel unit PU2 which are in each sub-pixel unit group share the same first data line DL1, and the third sub-pixel unit PU3 and the fourth sub-pixel unit PU4 which are in each sub-pixel unit group share the same second data line DL2, so the first sub-pixel unit PU1 and the second sub-pixel unit PU2 which are in each sub-pixel unit group are written with corresponding data signals during different periods, and the third sub-pixel unit PU3 and the fourth sub-pixel unit PU4 which are in each sub-pixel unit group are written with corresponding data signals during different periods. As can be seen from the above, the display panel 10 provided by the embodiments of the present disclosure can perform normal scanning and driving in accordance with the corresponding timing.

The display panel 10 provided by at least one embodiment of the present disclosure can reduce the number of data lines required to be provided without increasing the number of gate lines by sharing the data lines, so as to reduce the area of the region occupied by the data lines, such that the display panel 10 enables the sub-pixel units to be arranged in a region with a larger size, and the resolution of the display panel 10 can be improved, which is beneficial to realize a display panel with high PPI (Pixels Per Inch) and a narrow bezel. On the other hand, because the number of data lines required to be arranged are decreased, the number of pins, for the source driving circuit, of a circuit board is decreased, such that the processing yield of the display panel 10 can be improved and the production cost of the display panel 10 can be reduced.

For example, in the display panel 10 provided by some embodiments, in each sub-pixel unit group, the light emitted by the first sub-pixel unit PU1, the second sub-pixel unit PU2, the third sub-pixel unit PU3 and the fourth sub-pixel unit PU4 includes red light, green light, and blue light. For example, the sub-pixel unit which can emit the red light is denoted as R, the sub-pixel unit which can emit green light is denoted as G, and the sub-pixel unit which can emit blue light is denoted as B. For example, in the same row of sub-pixel units, along the first direction D1, the arrangement of sub-pixel units can be RGBR-GBRG-BRGB, and every four sub-pixel units are a sub-pixel unit group. In this case, every twelve sub-pixel units form a cycle. It should be noted that the embodiments of the present disclosure include but are not limited to this arrangement of sub-pixel units.

For example, in the display panel 10 provided by some embodiments, in each sub-pixel unit group, the light emitted by the first sub-pixel unit PU1, the second sub-pixel unit PU2, the third sub-pixel unit PU3 and the fourth sub-pixel unit PU4 may further include white light, and the sub-pixel unit which can emit white light is denoted as W. For example, in the same row of sub-pixel units, along the first direction D1, the arrangement of the sub-pixel units can be RGBW. It should be noted that the embodiments of the present disclosure include but are not limited to this arrangement of sub-pixel units.

The layout design of the array substrate of the display panel 10 provided by at least one embodiment of the present disclosure will be described with reference to FIG. 5-FIG. 7.

Figure 5:
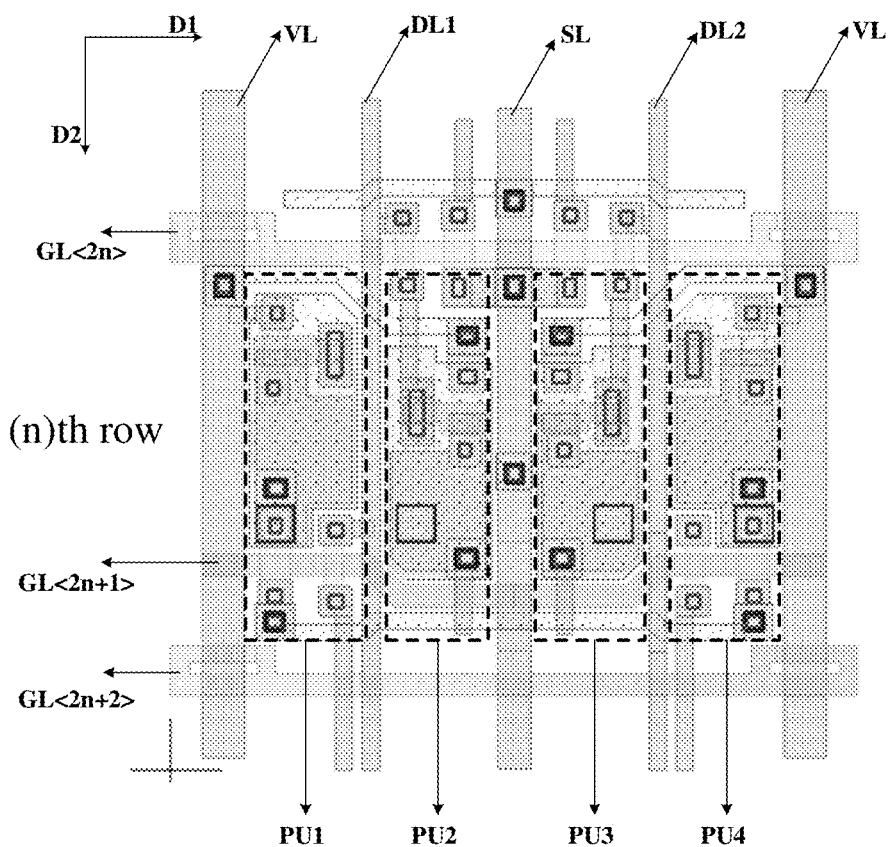
FIG. 5 is a schematic diagram of a layout of a display panel provided by at least one embodiment of the present disclosure.

FIG. 5 illustrates one row and four columns of sub-pixel units in the display panel 10, that is, one sub-pixel unit group. As illustrated in FIG. 5, the gate lines GL<2n>, GL<2n+1> and GL<2n+2> extend along the first direction D1. The first data line DL1, the second data line DL2, the sensing line SL and the power supply voltage line VL extend along the second direction D2.

As illustrated in FIG. 5, the first data line DL1 is between the first sub-pixel unit PU1 and the second sub-pixel unit PU2. For example, the first data line DL1 is connected with the first electrode of the first transistor T1 in the first sub-pixel unit PU1 and the first electrode of the first transistor T1 in the second sub-pixel unit PU2, respectively. The second data line DL2 is between the third sub-pixel unit PU3 and the fourth sub-pixel unit PU4. For example, the second data line DL2 is connected with the first electrode of the first transistor T1 in the third sub-pixel unit PU3 and the first electrode of the first transistor T1 in the fourth sub-pixel unit PU4, respectively.

As illustrated in FIG. 5, in this sub-pixel unit group, the first sub-pixel unit PU1, the second sub-pixel unit PU2, the third sub-pixel unit PU3 and the fourth sub-pixel unit PU4 are axially symmetrically distributed with respect to the sensing line SL. For example, the first sub-pixel unit PU1 and the second sub-pixel unit PU2 are distributed on the left side of the sensing line SL, and the third sub-pixel unit PU3 and the fourth sub-pixel unit PU4 are distributed on the right side of the sensing line SL. For example, the sensing line SL is connected with the first electrodes of the third transistors T3 in the first sub-pixel unit PU1, the second sub-pixel unit PU2, the third sub-pixel unit PU3 and the fourth sub-pixel unit PU4, respectively.

In the display panel 10 provided by the embodiments of the present disclosure, for each sub-pixel unit group, the layout structure can be optimized in layout design by adopting this axisymmetric distribution design with respect to the sensing line SL, thereby reducing the risk of short circuit and further improving the yield.

Figure 6:
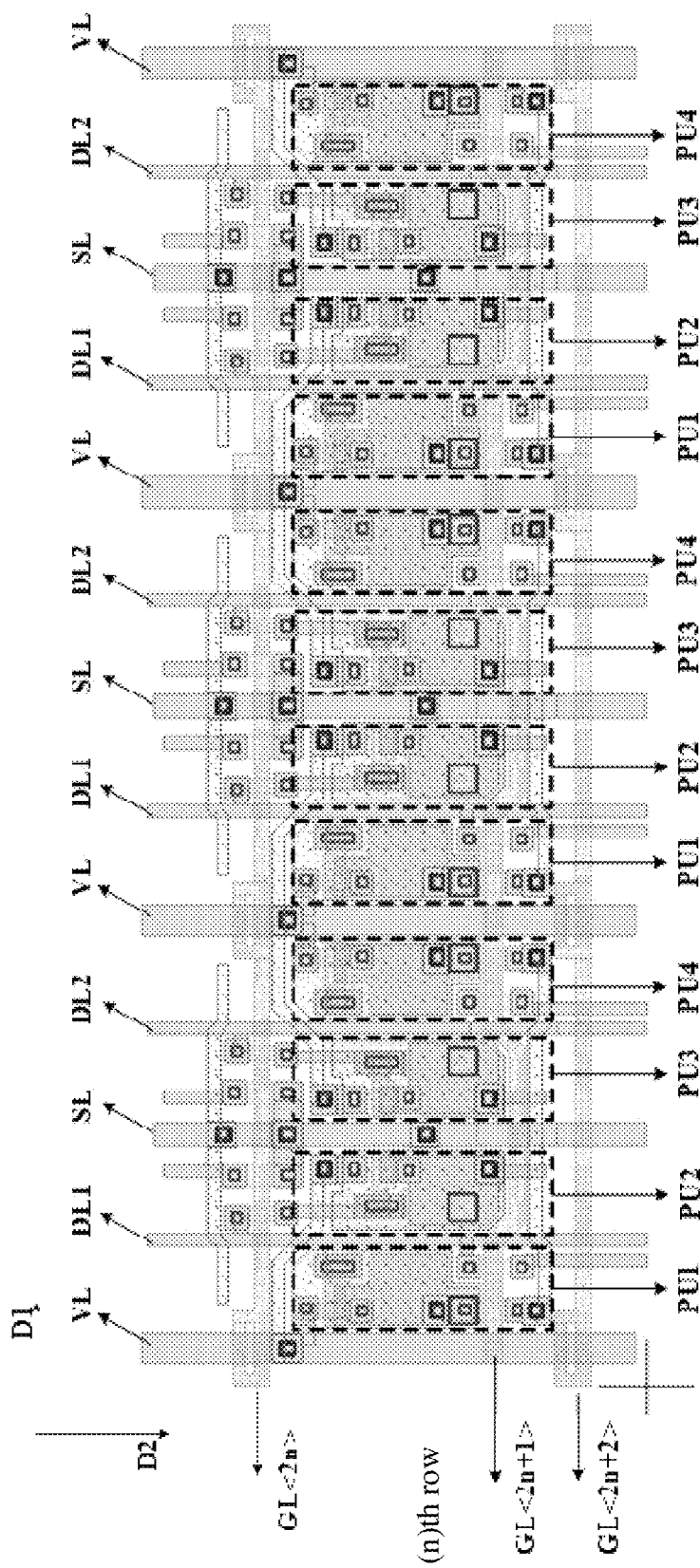
FIG. 6 is a schematic diagram of a layout of another display panel provided by at least one embodiment of the present disclosure.

FIG. 6 illustrates one row and twelve columns of sub-pixel units in the display panel 10, that is, three sub-pixel unit groups. For example, as illustrated in FIG. 6, one power supply voltage line VL is provided between every two adjacent sub-pixel unit groups, and the power supply voltage line VL is connected with the first electrodes of the second transistors T2 which are respectively in the third sub-pixel unit PU3 and the fourth sub-pixel unit PU4 which are on the left side of the power supply voltage line VL and the first electrodes of the second transistors T2 which are respectively in the first sub-pixel unit PU1 and the second sub-pixel unit PU2 which are on the right side of the power supply voltage line VL to provide the first power supply voltage.

The power supply voltage lines VL in the display panel 10 provided by the embodiments of the present disclosure adopt the non-mesh structure. Even in the case that one of the plurality of power supply voltage lines VL is defective, only the sub-pixel units connected with this power supply voltage line VL are affected, without affecting the sub-pixel units connected with other power supply voltage lines VL, thus improving the redundancy and stability of the display panel 10.

In addition, compared with the display panel adopting the mesh structure, the display panel 10 adopting the non-mesh structure provided by the embodiments of the present disclosure can also locate the position, at which a defect is present, of the power supply voltage line VL, so as to eliminate the defect.

It should be noted that other parts in FIG. 6 that are the same as those in FIG. 5 can refer to the corresponding descriptions in the above embodiments and will not be repeated here.

Figure 7:
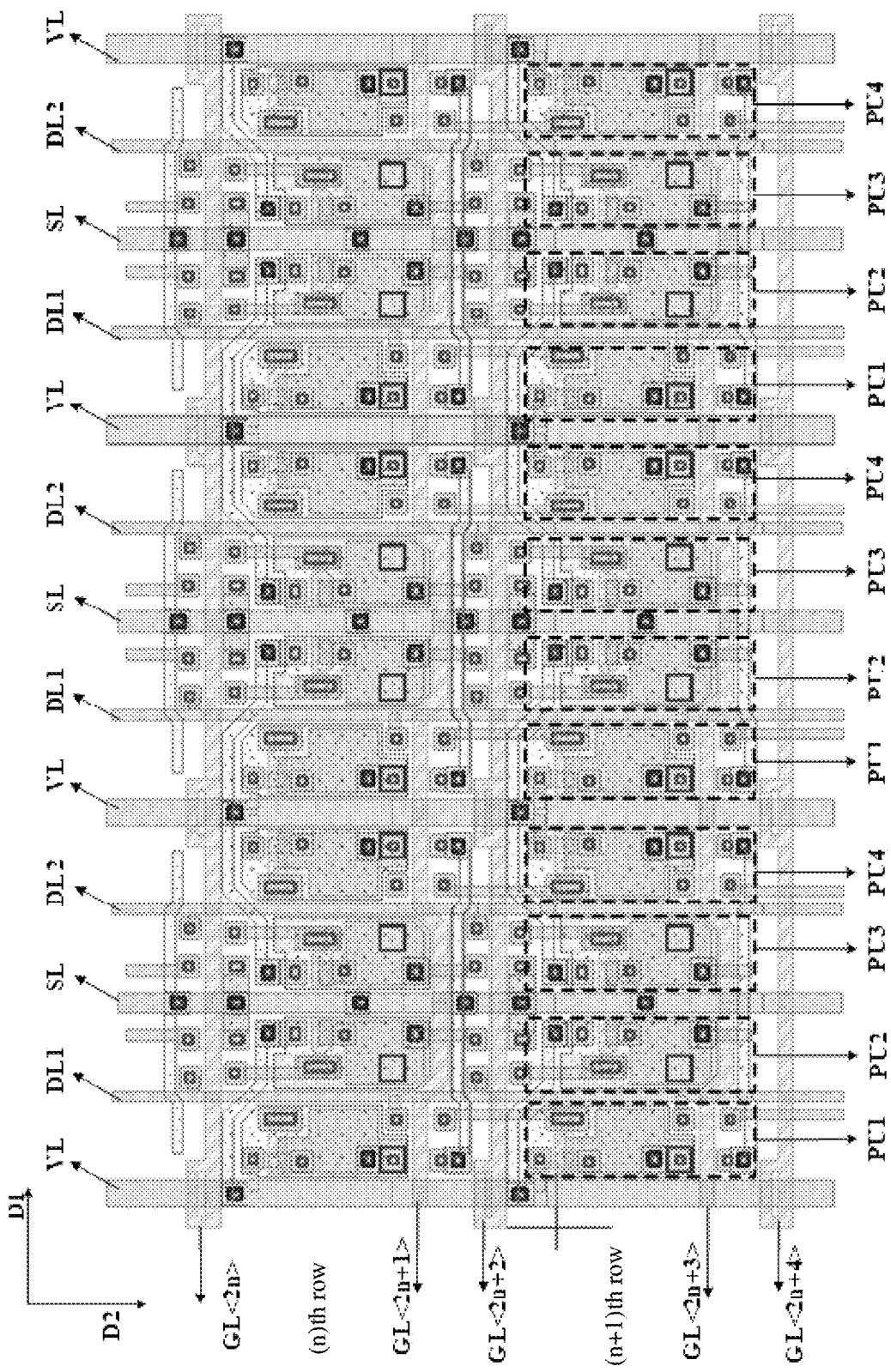
FIG. 7 is a schematic diagram of a layout of still another display panel provided by at least one embodiment of the present disclosure.

FIG. 7 illustrates two rows and twelve columns of sub-pixel units in the display panel 10, that is, each row illustrates three sub-pixel unit groups. For example, two gate lines GL<2n+1> and GL<2n+2> are arranged between the (n)th row of sub-pixel units and the (n+1)th row of sub-pixel units.

For example, as illustrated in FIG. 7, the gate electrode of the third transistor T3 in each first sub-pixel unit PU1 in the (n)th row of sub-pixel unit groups and the gate electrode of the third transistor T3 in each third sub-pixel unit PU3 in the (n)th row of sub-pixel unit groups are both connected with the (2n+1)th gate line GL<2n+1> to receive the gate scanning signal which serves as the sensing driving signal. For example, the sensing driving signal can control the third transistor T3 to be turned on or off.

The gate electrode of the third transistor T3 in each second sub-pixel unit PU2 in the (n)th row of sub-pixel unit groups and the gate electrode of the third transistor T3 in each fourth sub-pixel unit PU4 in the (n)th row of sub-pixel unit groups are both connected with the (2n+2)th gate line GL<2n+2> to receive the gate scanning signal which serves as the sensing driving signal.

The gate electrode of the first transistor T1 in each first sub-pixel unit PU1 in the (n+1)th row of sub-pixel unit groups and the gate electrode of the first transistor T1 in each third sub-pixel unit PU3 in the (n+1)th row of sub-pixel unit groups are both connected with the (2n+1)th gate line GL<2n+1> to receive the gate scanning signal which serves as the scanning driving signal.

The gate electrode of the first transistor T1 in each second sub-pixel unit PU2 in the (n+1)th row of sub-pixel unit groups and the gate electrode of the first transistor T1 in each fourth sub-pixel unit PU4 in the (n+1)th row of sub-pixel unit groups are both connected with the (2n+2)th gate line GL<2n+2> to receive the gate scanning signal which serves as the scanning driving signal.

For example, the display panel 10 provided by some embodiments of the present disclosure can adopt a top emission structure. For example, the display panel 10 further includes a pixel definition layer on the array substrate, the pixel definition layer has an opening in each sub-pixel unit, shapes of openings of the plurality of sub-pixel units are the same, and sizes of the openings of the plurality of sub-pixel units are the same.

Figure 8:
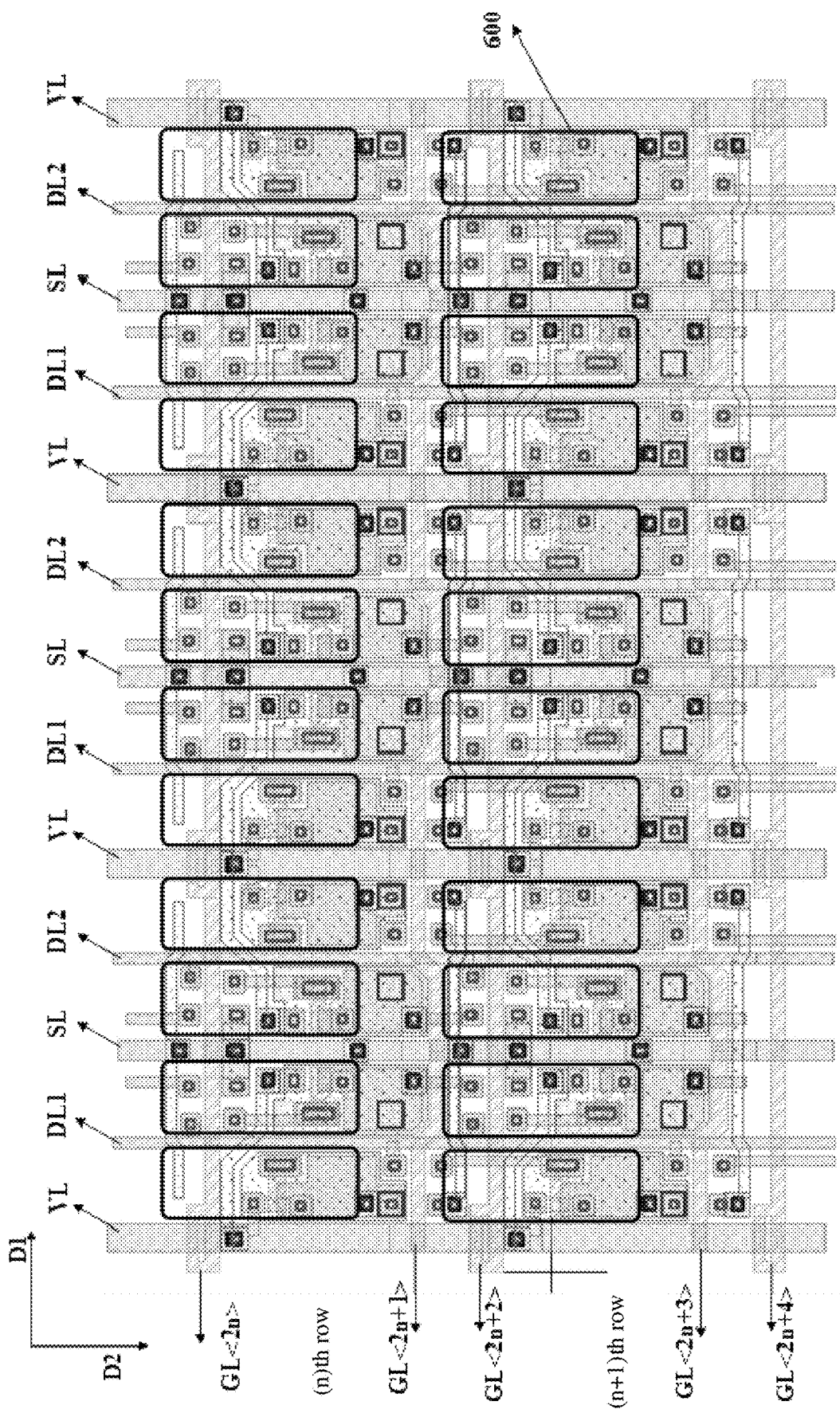
FIG. 8 is a schematic diagram of a layout of yet still another display panel provided by at least one embodiment of the present disclosure.

FIG. 8 illustrates the opening 600 in each sub-pixel unit with a rounded rectangle with bold lines. For example, the shapes of the openings 600 of the plurality of sub-pixel units are the same, and the sizes of the openings 600 of the plurality of sub-pixel units are the same. By adopting the above design of allowing the plurality of openings 600 to be the same, the display panel 10 provided by the embodiments of the present disclosure can improve the printing efficiency in manufacturing the display panel 10; in addition, the aperture ratio of the display panel 10 can be increased. For example, the aperture ratio of the display panel 10 can reach 40%-50%, for example, can be 46%.

Figure 10:
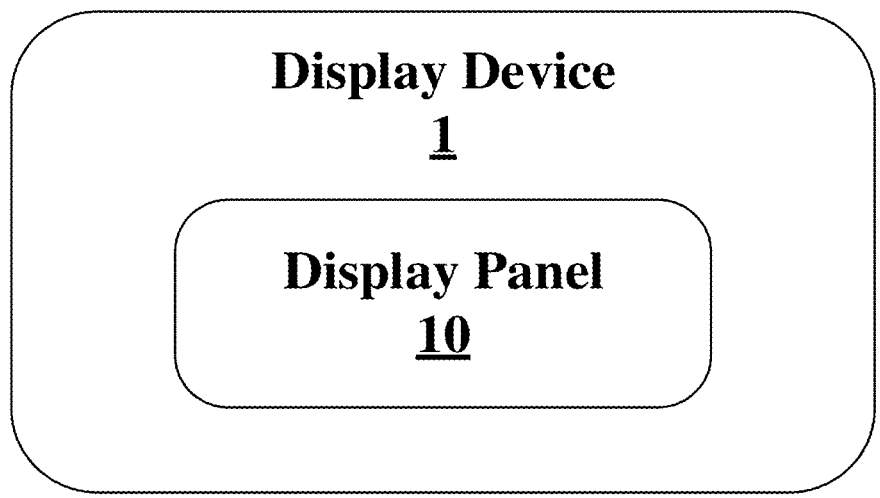
FIG. 10 is a schematic diagram of a display device provided by at least one embodiment of the present disclosure.

At least one embodiment of the present disclosure further provides a display device 1, as illustrated in FIG. 10, the display device 1 includes the display panel 10 provided by any one of the embodiments of the present disclosure, and the display device in the embodiment can be any product or component with display function, such as a display, an OLED panel, an OLED television, an electronic paper, a mobile phone, a tablet computer, a notebook computer, a digital photo frame, a navigator, etc.

The technical effects of the display device 1 provided by the embodiments of the present disclosure can be referred to the corresponding descriptions of the display panel 10 in the above embodiments, and will not be described in detail here.

What are described above is related to the illustrative embodiments of the disclosure only and not limitative to the scope of the disclosure; the scopes of the disclosure are defined by the accompanying claims.

What is claimed is:

1. A display panel, comprising a plurality of sub-pixel units arranged in an array, wherein the array comprises N rows and 4M columns,
   sub-pixel units in each row are divided into a plurality of sub-pixel unit groups, and each sub-pixel unit group comprises a first sub-pixel unit, a second sub-pixel unit, a third sub-pixel unit and a fourth sub-pixel unit which are sequentially in four adjacent columns along a first direction;
   each sub-pixel unit of the plurality of sub-pixel units comprises a light emitting circuit, a pixel driving circuit for driving the light emitting circuit to emit light, and a sensing circuit for sensing the pixel driving circuit to realize external compensation;

the display panel further comprises (2N+2) gate lines which are arranged along the first direction and configured to provide a gate scanning signal to the plurality of sub-pixel units;

the pixel driving circuit in each first sub-pixel unit in an (n)th row of sub-pixel unit groups and the pixel driving circuit in each third sub-pixel unit in the (n)th row of sub-pixel unit groups are both connected with a (2n−1)th gate line of the (2N+2) gate lines to receive the gate scanning signal and use the gate scanning signal as a first scanning driving signal;

the pixel driving circuit in each second sub-pixel unit in the (n)th row of sub-pixel unit groups and the pixel driving circuit in each fourth sub-pixel unit in the (n)th row of sub-pixel unit groups are both connected with a (2n)th gate line of the (2N+2) gate lines to receive the gate scanning signal and use the gate scanning signal as a second scanning driving signal;

the sensing circuit in each first sub-pixel unit in the (n)th row of sub-pixel unit groups and the sensing circuit in each third sub-pixel unit in the (n)th row of sub-pixel unit groups are both connected with a (2n+1)th gate line of the (2N+2) gate lines to receive the gate scanning signal and use the gate scanning signal as a first sensing driving signal;

the sensing circuit in each second sub-pixel unit in the (n)th row of sub-pixel unit groups and the sensing circuit in each fourth sub-pixel unit in the (n)th row of sub-pixel unit groups are both connected with a (2n+2)th gate line of the (2N+2) gate lines to receive the gate scanning signal and use the gate scanning signal as a second sensing driving signal;

the display panel further comprises a plurality of first data lines and a plurality of second data lines which are arranged along a second direction, in the second direction, both of the first sub-pixel unit and the second sub-pixel unit in the each sub-pixel unit group are connected with a same first data line to receive a first data signal; in the second direction, both of the third sub-pixel unit and the fourth sub-pixel unit in the each sub-pixel unit group are connected with a same second data line to receive a second data signal; and $1 \leq n \leq N$, M is an integer greater than or equal to 1, and N is an integer greater than or equal to 2.

2. The display panel according to claim 1, wherein two gate lines are between every two adjacent rows of sub-pixel units, and two gate lines are respectively arranged at two sides of the array along the second direction.

3. The display panel according to claim 1, wherein in the each sub-pixel unit group, the first data line is between first sub-pixel unit and the second sub-pixel unit, and the second data line is between the third sub-pixel unit and the fourth sub-pixel unit.

4. The display panel according to claim 1, further comprising a plurality of sensing lines extending along the second direction, wherein
in the second direction, the first sub-pixel unit, the second sub-pixel unit, the third sub-pixel unit and the fourth sub-pixel unit in the each sub-pixel unit group are all connected with a same sensing line to receive a reference voltage signal or output a sensing voltage signal.

5. The display panel according to claim 4, wherein in the each sub-pixel unit group, the same sensing line is between the second sub-pixel unit and the third sub-pixel unit.

6. The display panel according to claim 4, wherein in the each sub-pixel unit group, the first sub-pixel unit, the second sub-pixel unit, the third sub-pixel unit and the fourth sub-pixel unit are axially symmetrically distributed with respect to the same sensing line.

7. The display panel according to claim 1, further comprising a plurality of power supply voltage lines extending along the second direction, wherein
in every two adjacent sub-pixel unit groups, the third sub-pixel unit and the fourth sub-pixel unit which are in a left sub-pixel unit group of the two adjacent sub-pixel unit groups and the first sub-pixel unit and the second sub-pixel unit which are in a right sub-pixel unit group of the two adjacent sub-pixel unit groups are all connected with a same power supply voltage line to receive a first power supply voltage.

8. The display panel according to claim 7, wherein in the second direction, the same power supply voltage line is between the two adjacent sub-pixel unit groups.

9. The display panel according to claim 7, further comprising a power supply voltage bus, wherein the plurality of power supply voltage lines are respectively connected with the power supply voltage bus.

10. The display panel according to claim 7, wherein the plurality of power supply voltage lines are further configured to be detected in a detection stage to determine whether each of the plurality of power supply voltage lines is defective.

11. The display panel according to claim 1, wherein the sensing circuit is configured to sense the pixel driving circuit to obtain a threshold voltage or electron mobility of the pixel driving circuit.

12. The display panel according to claim 1, wherein the pixel driving circuit comprises a data writing circuit, a driving circuit and a charge storage circuit;

the driving circuit is connected with the data writing circuit, the charge storage circuit, the light emitting circuit and the sensing circuit, and is configured to control a driving current for driving the light emitting circuit to emit light;

the data writing circuit is further connected with the charge storage circuit, and is configured to receive the first scanning driving signal or the second scanning driving signal and write the first data signal or the second data signal into the driving circuit in response to the first scanning driving signal or the second scanning driving signal;

the sensing circuit is further connected with the charge storage circuit and the light emitting circuit, and is configured to receive the first sensing driving signal or the second sensing driving signal, and write a reference voltage signal into the driving circuit or read out a sensing voltage signal from the driving circuit in response to the first sensing driving signal or the second sensing driving signal; and the charge storage circuit is further connected with the light emitting circuit, and is configured to store the first data signal or the second data signal and the reference voltage signal that are written into the charge storage circuit.

13. The display panel according to claim 12, wherein
the data writing circuit comprises a first transistor, a gate electrode of the first transistor is configured to receive the gate scanning signal, a first electrode of the first transistor is configured to receive the first data signal or the second data signal, and a second electrode of the first transistor is connected with a first node;

the driving circuit comprises a second transistor, a gate electrode of the second transistor is connected with the first node, a first electrode of the second transistor is connected with a power supply voltage line to receive a first power supply voltage, and a second electrode of the second transistor is connected with a second node;

the charge storage circuit comprises a storage capacitor, a first electrode of the storage capacitor is connected with the first node, and a second electrode of the storage capacitor is connected with the second node;

the sensing circuit comprises a third transistor, a gate electrode of the third transistor is configured to receive the gate scanning signal and use the gate scanning signal as the first sensing driving signal or the second sensing driving signal, a first electrode of the third transistor is connected with a sensing line, and a second electrode of the third transistor is connected with the second node; and the light emitting circuit comprises an organic light-emitting diode, a first electrode of the organic light-emitting diode is connected with the second node, and a second electrode of the organic light-emitting diode is configured to receive a second power supply voltage.

14. The display panel according to claim 1, wherein in the each sub-pixel unit group, light emitted by the first sub-pixel unit, the second sub-pixel unit, the third sub-pixel unit and the fourth sub-pixel unit comprises red light, green light and blue light.

15. The display panel according to claim 14, wherein in the sub-pixel units in each row, light emitted by the sub-pixel units are circulated according to an order of red light, green light, and blue light along the first direction.

16. The display panel according to claim 14, wherein in the each sub-pixel unit group, the light emitted by the first sub-pixel unit, the second sub-pixel unit, the third sub-pixel unit and the fourth sub-pixel unit further comprises white light.

17. The display panel according to claim 16, wherein in the each sub-pixel unit group, an order of the light emitted by the first sub-pixel unit, the second sub-pixel unit, the third sub-pixel unit and the fourth sub-pixel unit is red light, green light, blue light and white light.

18. The display panel according to claim 1, wherein the sub-pixel units adopt top emission structures.

19. The display panel according to claim 18, further comprising a pixel definition layer on an array substrate, wherein the pixel definition layer has an opening in each sub-pixel unit, shapes of openings of the plurality of sub-pixel units are the same, and sizes of the openings of the plurality of sub-pixel units are the same.

20. A display device, comprising the display panel according to claim 1.

* * * * *